United States Patent [19]
Romeo et al.

[11] 3,891,936
[45] June 24, 1975

[54] LOW FREQUENCY FIELD EFFECT AMPLIFIER

[75] Inventors: Donald E. Romeo, Torrance; Archie J. MacMillan, Long Beach, both of Calif.

[73] Assignee: TRW Inc., Redondo Beach, Calif.

[22] Filed: Aug. 5, 1974

[21] Appl. No.: 494,588

Related U.S. Application Data

[63] Continuation of Ser. No. 266,155, June 26, 1972, abandoned.

[52] U.S. Cl. .................... 330/28; 330/35; 330/110; 307/304; 307/311; 357/41
[51] Int. Cl. .................... H03f 3/16
[58] Field of Search .................... 330/35, 28, 110; 313/365-367; 357/30-32; 307/41, 304, 311

[56] References Cited

UNITED STATES PATENTS

| | | | |
|---|---|---|---|
| 3,434,068 | 3/1969 | Seven | 330/35 X |
| 3,569,732 | 3/1971 | Christensen | 307/304 X |
| 3,772,607 | 11/1973 | Luckett et al. | 330/35 |

*Primary Examiner*—James B. Mullins
*Attorney, Agent, or Firm*—Daniel T. Anderson; Benjamin DeWitt

[57] ABSTRACT

AC coupled amplifier employing metal oxide semiconductor (MOS) field effect transistors and providing improved bias stability of the principal MOSFET stage together with very substantially improved response to subaudio frequencies. A drain-to-gate connected second MOSFET device is used to provide an ultra high impedance negative feedback and biasing circuit. The amplifier circuit, preferably in the form of a monolithic integrated circuit structure, is particularly suitable for large scale integration of systems requiring AC coupling of subaudio frequencies because the ultra high impedances realized in the amplifier input circuit make it possible to employ an integrated input coupling capacitance of the order of a few picofarads while nevertheless acheiving a low-end cut-off frequency of about 2 to 20 Hertz.

12 Claims, 4 Drawing Figures

PATENTED JUN 24 1975 3,891,936

LOW FREQUENCY FIELD EFFECT AMPLIFIER

This is a continuation of our prior copending application Ser. No. 266,155 filed June 26, 1972 and now abandoned.

BACKGROUND OF THE INVENTION

This invention relates to AC coupled semiconductor circuit arrangements and more particularly to a circuit utilizing MOS field effect transistors in a low frequency amplifier arrangement suitable for large scale integration. For many purposes one would like to AC couple one or more MOS amplifier stages in a monolithic integrated circuit structure. In LSI structures the drive for higher component packing densities militates against the use of large coupling capacitors, and in general it is highly desirable to limit the capacitors used to capacitances of the order of a few picofarads. When conventional prior art biasing networks, such as voltage dividers and the like, are used with such small coupling capacitances it is, in general, not possible to obtain a good frequency response extending downwardly to the lower end of the subaudio range.

Accordingly, it is a primary object of the invention to provide a MOSFET amplifier suitable for use in monolithic integrated circuits and having a frequency response characteristic which is relatively very flat to a lower corner frequency of the order of 20 Hertz or lower.

It is a further object to provide an AC coupled MOS gain stage suitable for multiple implementation in LSI structures and in which the DC output voltage level is considerably less sensitive to variations in the threshold voltage characteristic from device to device.

It is a further object to provide an AC coupled MOSFET amplifier having an improved power supply rejection characteristic.

It is a further object to provide an AC coupled MOSFET amplifier having a lower corner frequency in the range from 2 to about 20 Hertz and utilizing an input coupling capacitor of a small enough size to be readily realizable in monolithic integrated circuits and/or large scale integration.

SUMMARY OF THE INVENTION

An AC coupled MOSFET amplifier in accordance with the present invention comprises a semiconductor substrate of a first conductivity type which may, for example, be a wafer of n-type silicon. The wafer may include a large plurality of amplifier circuit cells arranged in rows and columns. It will be understood that the following description relates to the circuitry and structure of one such circuit cell. The amplifier comprises a first MOS field effect device formed on said substrate and having the usual drain, source and gate electrodes. A load means, which preferably comprises a gate-to-drain connected field effect transistor, is connected in the source-drain external circuit of the first MOSFET device for developing amplified output signals in response to input signals applied to the gate electrode of the first MOSFET device. In accordance with the invention a feedback means, comprising a second MOSFET device arranged to operate near the threshold current level is connected from the drain electrode to the gate electrode of the first MOSFET device and serves to provide negative feedback, for gain and output level stabilization, while at the same time exhibiting an ultra-high impedance in the amplifier input circuit so that, even with the use of an input coupling capacitance of the order of a few picofarads, it is possible to realize a frequency response characteristic having a lower corner frequency of the order of 2 to 20 Hertz.

The novel features that are considered characteristic of this invention are set forth with particularlity in the appended claims. The foregoing and other objects and features of this invention will be more apparent and best understood from the following description considered with the accompanying drawings.

DESCRIPTION OF THE PREFERRED EMBODIMENT

While the present invention may find application in various systems where it is desirable to utilize field effect transistors for amplification of low frequency AC signals, it has been found particularly useful in a system employing MOS/LSI signal amplification and processing to develop, from an integrated circuit array of photosensitive cells, a video signal representative of an electromagnetic radiation image impinging such array. For convenience the invention is hereafter described with reference to the particular embodiment which has been found most suitable for use in one such imaging or detection apparatus. It is to be understood that application of the invention is not restricted to image scanning apparatus or to any particular use or system.

In general, the imaging or detection system comprises an array of photosensitive sensor cells organized into a grid of rows and columns and on which a real image of a field of view may be focused. Each cell may, for example, be a lead sulphide or lead selenide element having an area of about 50 to 100 square mills. The cells preferably are arranged on 10 mil centers on a single monolithic silicon substrate.

For adequate image resolution together with satisfactory signal to noise ratio performance, it is necessary that each sensor cell be provided with its own signal amplification prior to sequential interrogation of the rows and columns to develop a video output signal. The primary thrust of the present invention relates to the AC coupled preamplifier circuits located on the silicon substrate underneath their respective sensor cells. Each such circuit is required to occupy an area no greater than its associated sensor cell, must provide voltage gain at frequencies down to about 20 Hertz (and preferably to 2 Hertz), must produce an output signal acceptable for sequential interrogation by conventional scanning circuitry (i.e., with a reasonably consistent DC output level from cell-to-cell), and must be manufacturable in LSI form in arrays of hundreds or thousands of circuits by means of integrated circuit processing technology which is compatible with the deposition of the lead sulphide or lead selenide elements.

Figures 1, 2:
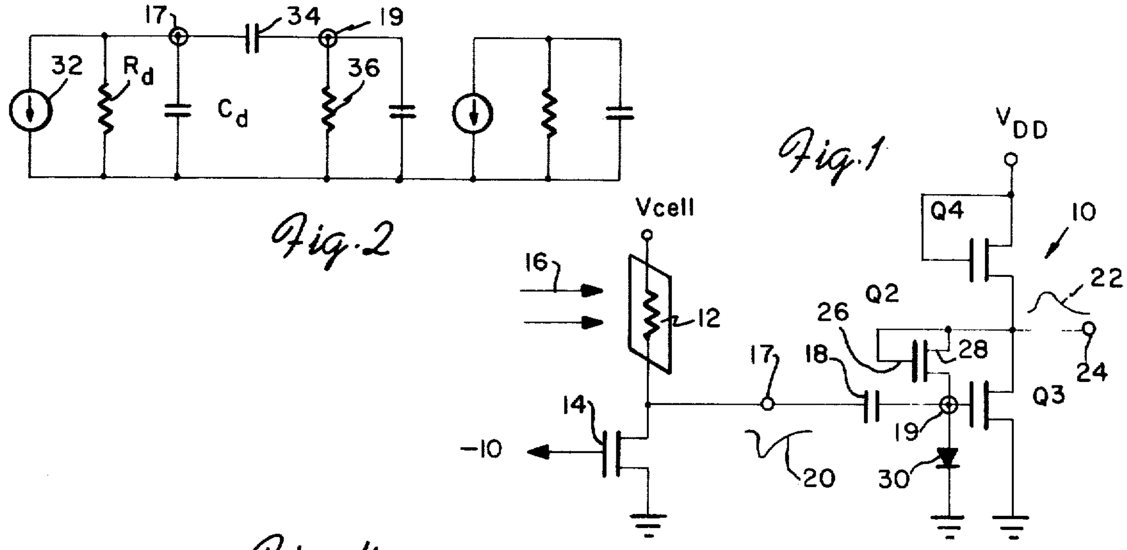
FIG. 1 is a schematic circuit diagram of an AC coupled amplifier circuit in accordance with the invention.
FIG. 2 is an AC equivalent circuit illustrating certain electrical characteristics of the amplifier shown in FIG. 1.

FIG. 1 schematically illustrates one such AC coupled preamplifier circuit 10 together with its associated photoconductive cell 12, it being understood that an imaging or detection apparatus as previously discussed comprises at least hundreds and preferably thousands of such circuits arranged in rows and columns to form a grid. As shown in FIG. 1, photosensor 12 is connected in circuit with a MOSFET device 14 to a biasing source $V_{cell}$. MOSFET 14 is separately biased to function as a constant current source. The junction point between sensor 12 and MOSFET 14 is connected by way of point 17 through a small capacitor 18 to the gate electrode of MOSFET $Q_3$ which is the primary amplification device of the circuit. The source electrode of $Q_3$ is connected to substrate ground and its drain electrode is connected through load device $Q_4$ to a source of energizing potential $V_{dd}$. The load device $Q_4$ preferably consists of a MOSFET device connected to function as a load resistance, i.e., with the gate electrode connected directly to the drain electrode and the energizing source $V_{dd}$. For LSI implementation the capacitor 18 preferably should occupy a very small area of the order of 20 square mils or less and accordingly is limited in capacitance to a few picofarads. In one exemplary embodiment, capacitor 18 has an area of 14.6 square mils and a capacitance of about 2.9 picofarads.

To consider the operation of the circuit of FIG. 1, it is useful to assume a transient flash of radiation represented by rays 16 falling on photosensor 12. The impinging radiation reduces the resistance of sensor 12 from its dark resistance level so that the voltage at point 17 goes more negative during the time duration of the transient radiation pulse. This transient change of potential of point 17 is represented by pulse 20 in FIG. 1. Pulse 20 is AC coupled through capacitor 18 to point 19 and to the gate electrode of MOSFET $Q_3$. MOSFET $Q_3$ preferably is a p-channel enhancement device; accordingly, the negative-going pulse 20 applied to the gate electrode increases the conductivity of the source-drain current path of $Q_3$ whereby a positive-going pulse 22 appears at the drain electrode. The drain electrode of $Q_3$ is also connected directly to an output terminal 24 from which the positive-going output pulse may be derived by means of conventional scanning or interrogating circuitry (not shown). Alternatively, of course, additional amplification or buffering such as a source-follower circuit might be provided at output electrode 24 prior to application of the output signal to the scanning circuitry. In actual practice, in imaging or detection systems, the radiation signal input to a given photosensor 12 frequently has a major energy content in the subaudio frequency range. Accordingly it is important that the circuits associated with each detector have a lower corner frequency below about 20 Hertz.

In accordance with the present invention there is additionally provided a feedback MOSFET device $Q_2$ connected from the drain electrode of $Q_3$ to point 19 and hence to the gate electrode of $Q_3$. Specifically, the integrated circuit MOSFET device $Q_2$ has its gate electrode 26 connected directly to the drain electrode 28 with the two being connected directly to the drain electrode of $Q_3$. The source electrode of $Q_2$ is connected to point 19. For reasons that will be considered hereinafter, the feedback device $Q_2$ preferably has a dynamic resistance of the order of $10^{10}$ ohms or greater. Conventional resistors having resistance values of that order are not practically realizable in high component density MOS integrated circuit structures. The present applicants have recognized that several advantages accrue by using a MOSFET device $Q_2$ as the feedback mechanism.

Also indicated schematically in FIG. 1 is a reverse-biased diode 30 connected from point 19 to substrate ground. It is important to understand that this diode 30 does not exist as a separate and discrete element in the circuit but rather is provided by the p-n junction which unavoidably exists between the source region of $Q_2$ and the silicon substrate. The leakage current provided by diode 30 is sufficient to keep MOSFET $Q_2$ turned "on" slightly so that it operates in the threshold region of the source-drain current characteristic and thereby functions as a very high impedance ($10^9$ to $10^{13}$ ohms) between the output electrode 24 and the gate of amplifier $Q_3$. This drain-to-gate feedback around $Q_3$ by way of $Q_2$ provides appropriate biasing of the gate circuit of $Q_3$ without the use of a conventional comparatively low impedance biasing network such as voltage dividers and the like. The fact that relatively low impedance biasing networks are avoided means that the AC equivalent impedance to ground at point 19 is very high and accordingly an RC time constant suitable for good low frequency response is achieved in the input circuit of $Q_3$, even though the capacitance of capacitor 18 cannot practically be made greater than about 20 pf and more commonly is of the order of 5 pf for arrays having circuits on 10 mil centers. It is to be recognized that the circuit of FIG. 1 normally operates in the small signal mode. That is, the input pulse 20 will normally be of the order of a few millivolts or less.

FIG. 2 illustrates the AC equivalent circuit of the amplifier shown in FIG. 1. In the equivalent circuit numeral 32 denotes an alternating current generator representative of the AC signal generated by electromagnetic radiation signal fluctuations falling on sensor 12 of FIG. 1. $R_d$ is the equivalent resistance of the photosensor 12 and MOSFET 14 as seen from point A; $C_d$ is the sensor capacitance as seen from input terminal 17; capacitance 34 represents the capacitance of capacitor 18 in FIG. 1; and resistance 36 is the equivalent AC impedance at the gate of the amplifier $Q_3$ to substrate ground. Due to the Miller effect, the equivalent circuit resistance 36 has a value $R_{Q2}/(1 - A_r)$ wherein $R_{Q2}$ is the actual resistance of device $Q_2$ in FIG. 1 and $A_r$ is the voltage gain from the input terminal 19 to the output terminal 24.

For first order approximation, the lower corner frequency of the circuit of FIG. 1 (i.e., the low frequency corner of the bandpass characteristic at which the voltage gain falls 3 db) can be shown to be $$f_1 \approx \frac{1}{2\pi \cdot \left[\frac{R_{Q2}}{(1 - A_r)}\right] \cdot C_1}$$

wherein, $C_1$ is the coupling capacitance 34 in the equivalent circuit (FIG. 2), $R_{Q2}$ is the source-drain resistance of feedback device $Q_2$, and $A_r$ is the voltage gain of the amplifier from input 19 to the output 24.

Assuming a readily achievable voltage gain value of about 8 and a $C_1$ coupling capacitance of about 2.9 pf, it may be seen from the above equation that, with a feedback resistance $R_{Q2}$ equal to about $10^{11}$ or $10^{12}$ ohms, a lower corner frequency substantially below 20 cycles per second is readily obtainable.

Figure 4:
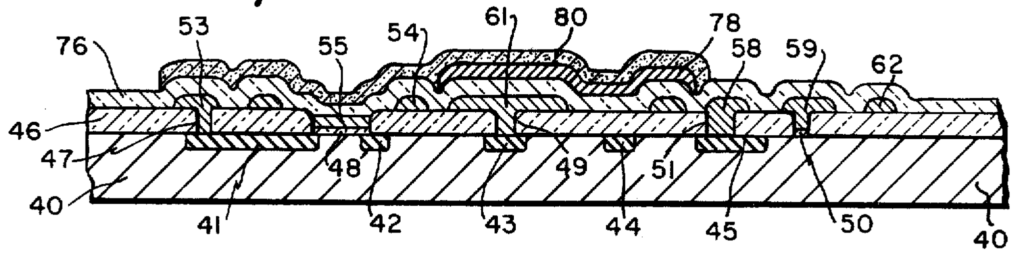
FIG. 4 is a cross-sectional view taken on the line 4—4 of FIG. 3.
Figure 3:
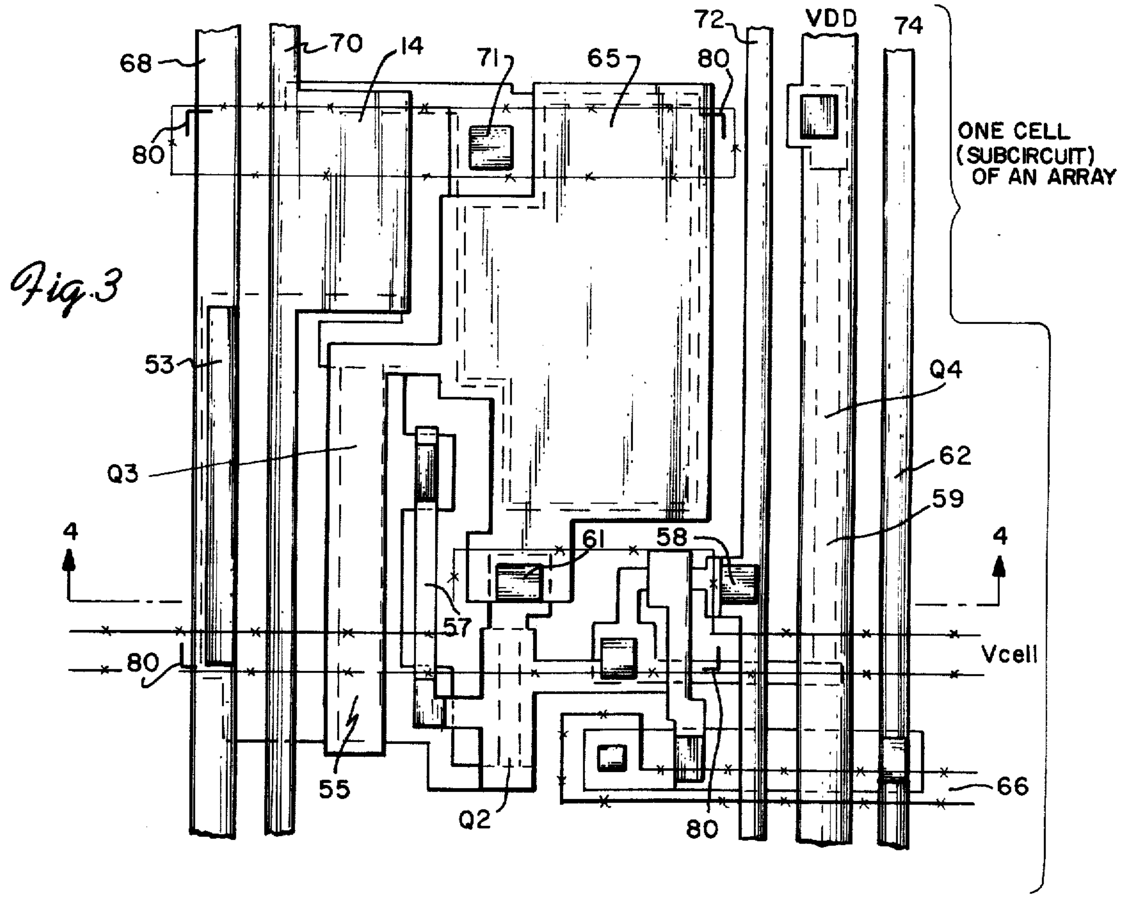
FIG. 3 is a plan view showing one complete circuit cell of a monolithic integrated circuit implementation of the circuit of FIG. 1.

As previously mentioned, the self-biased amplifier circuit of FIG. 1 is implemented in large scale integration form using MOS processes and MOS field effect transistors. More specifically, to achieve a satisfactory imaging device, it is necessary to provide a grid of thousands of photosensor elements arranged in rows and columns with each photosensor 12 and its associated amplifier 10 occupying an area of not more than about 10 mils by 10 mils. FIGS. 3 and 4 illustrate a monolithic MOS implementation of one cell of such an array. It is to be noted that the structure shown in FIG. 3 is preferably not more than 0.010 by 0.010 inches and incorporates not only all the circuit elements as shown schematically in FIG. 1 but also the photoconductive sensor 12 which, per se, is 7.4 mils long by 7.2 mils wide.

Fabrication of the monolithic structure preferably proceeds as follows. In a first step the n-type silicon wafer 40 is oxidized over its entire surface to provide a readily etchable layer of silicon oxide. Employing a first mask the oxide is then etched to form a plurality of spaced apertures and subsequently *p+* diffusion (in accordance with conventional practice) is employed to provide the five spaced *p+* regions 41–45. As will become more apparent, these five *p+* regions ultimately form the sources and drains of the several MOSFET devices shown in FIG. 1.

In a next step the wafer is oxidized over its entire surface to form a field-oxide layer 46 of silicon dioxide. Employing a second mask layer 46 is then etched to open apertures 47 through 51, after which a layer of gate-oxide dielectric is thermally grown on the surface of the silicon in apertures 47 through 51.

In a next step the wafer is appropriately masked and etched to remove the thermally grown oxide from apertures 47, 49 and 51 only thereby leaving layers 48 and 50 which ultimately form the dielectric which insulates the gate electrode from the source-to-drain channel of the two corresponding MOSFET devices $Q_3$ and $Q_4$.

In a next step, an aluminum layer is vacuum deposited over the entire wafer, after which portions of the aluminum are etched away (utilizing a fourth mask) to selectively provide metallic drain electrodes and source electrodes for the several MOSFET devices, the metallic upper plate 65 of capacitor 18, and conductive inleads 62 through 74 for interconnection and application of the several required biasing voltages.

In a next step a layer 76 of silicon dioxide is deposited over the entire surface of the wafer using a conventional silane reactor technique and a fifth mask is then used to etch through the silicon dioxide layer 76 in area 71 (FIG. 3) to expose the silicon substrate in that area. This exposure of the silicon provides access to the p+ region in area 71 so that a conductive connection can subsequently be made from the drain electrode of MOSFET 14 to photosensor 12 and capacitor 18.

Thereafter, a thin layer of chromium and a layer of gold 78 are applied, in that order, to the surface of the silicon dioxide layer 76. This relatively thin gold layer 78 provides a conductive interconnection from the capacitor 18 to the *p+* region at area 71 (thereby forming the drain electrode of MOSFET 14) and to the underside of the subsequently applied lead sulphide or lead selenide layer 80 as shown in FIG. 4. The outlines of the evaporated gold layer 78 are indicated by the line symbol * * * in FIG. 3. The lead sulphide or lead selenide layer 80 which forms the photosensor 12 of FIG. 1 is, for clarity, not shown in full in FIG. 3 but its four corners are indicated by the reference numeral 80 in FIG. 3. In accordance with the particular embodiment a wet process is used for applying the layer 80 and the structure of the monolithic device as shown in FIG. 4 is thereby completed.

It will be understood that the photosensitive lead sulphide layer 80 covers a major portion of the circuit cell (i.e., about 53% in the particular embodiment). This feature of the invention is advantageous in that, for a given irradiance the voltage input to each circuit is maximized by increasing the area of photosensor 12.

The leakage diode 30 as illustrated in FIG. 1 does not appear in FIGS. 3 and 4 as a discrete element but rather unavoidably exists as a parasitic p-n junction formed between the p-type region 43 (FIG. 4) and the n-type substrate 40. In accordance with the present invention the magnitude of the reverse bias leakage current of diode 30 and the effective resistance of the source-to-drain current path of MOSFET $Q_2$ are adjusted by knowledgeable and considered choice of the dimensions of the p+ region 43. In this manner the circuit of FIG. 1 is provided with an appropriate amount of feedback to achieve the desired low corner frequency and at the same time the biasing voltage for amplifier $Q_3$ is stably predetermined.

In one actual physical embodiment of a mosaic sensing array in accordance with the present invention, the following exemplary component dimensions and component values for the circuit of FIG. 1 were successfully employed:

Table I

| | Length (mils) | Width (mils) |
|---|---|---|
| Photoconductive Cell 12 | 7.4 | 7.2 |
| MOSFET 14 | 2.6 | 1.5 |
| MOSFET $Q_2$ | 1.7 | 0.3 |
| MOSFET $Q_3$ | 0.6 | 5.0 |
| MOSFET $Q_4$ | 6.5 | 0.3 |
| Capacitor 18 | area 14.6 sq. mils | |

It is understood that the foregoing tabulated component values and dimensions are given merely by way of example and are not intended to limit the present invention in any way.

Further while the present invention has been illustrated and described with reference to one exemplary embodiment only, it will be apparent to those skilled in the art that it is not so limited but is susceptible to various changes and modifications without departing from the spirit and scope thereof.

What is claimed is:

1. A field effect circuit comprising:

a silicon substrate;

a first MOS field effect device formed on said substrate and having a channel, with drain and source electrodes connected to said channel and a control gate associated with said channel;

load means connected in the drain-source external circuit of said device for developing output signals in response to gate voltage induced variations in the conductivity of said channel;

an integrated circuit capacitor formed as a metallized layer on a portion of said substrate, having one terminal connected to the control gate of said first MOS device and having the other terminal connected to a source of input signals to be amplified; and dynamic feedback means coupled between the drain and the gate of said first MOS device for providing signal frequency negative feedback and biasing and stabilizing the operating point of said first MOS device;

said feedback means comprising a gate-to-drain connected second MOSFET device constructed and arranged to operate near the threshold current level and to thereby exhibit a dynamic resistance, for small signals, of the order of $10^9$ to $10^{13}$ ohms;

whereby the frequency response characteristic of said circuit is characterized by a low frequency corner of the order of about 20 Hertz or less.

2. A circuit in accordance with claim 1 wherein said load means comprises a gate-to-drain connected MOSFET device.

3. A circuit in accordance with claim 1 wherein said second MOSFET device has associated therewith a source-to-substrate p-n junction having electrical parameters such that the reverse current supplied therefrom is sufficient to maintain said second MOSFET device biased to operate in a slightly "on" condition.

4. A monolithic integrated circuit array having a large plurality of subcircuits arranged in rows and columns to form a grid with each of said subcircuits occupying a substrate area of the order of 100 square mils or less and each subcircuit comprising in combination:

a first MOSFET having a channel and having drain and source electrodes connected to, and at least one control gate associated with, said channel;

load means for deriving output signals from the source-drain external circuit of said first MOSFET;

dynamic feedback means comprising a second MOSFET coupled between said load means and said control gate; for providing signal frequency negative feedback to said first MOSFET;

an AC signal coupling capacitor formed as a metallized layer on a portion of the same semiconductive substrate with said MOSFET devices and having a capacitance of the order or picofarads;

a dielectric layer overlying substantially the entire area occupied by said capacitor and said MOSFET devices;

and a sensor element, in the form of a layer of photosensitive material superimposed on said dielectric layer and covering a major portion of the area of the same subcircuit, for providing signals representative of intensity variations in the electromagnetic radiation impinging thereon;

each capacitor being connected to apply AC signals from its associated sensor element to the control gate of its associated first MOSFET device;

and each said second MOSFET device being arranged to operate near the threshold current level and to have an effective resistance which is proportioned relative to the capacitance value of its associated coupling capacitor so that a majority of said subcircuits have a frequency response characteristic in which the lower corner frequency is about 20 Hertz or less.

5. An integrated circuit array in accordance with claim 4 wherein each second MOSFET has associated therewith a source-to-substrate p-n junction, and wherein such p-n junction and the source-drain current path of said second MOSFET device form an ultra-high impedance biasing network for stabilizing the DC bias applied to the associated first MOSFET device, whereby the statistical spread of the DC levels derived from the plurality of said load means is significantly minimized.

6. An integrated circuit array in accordance with claim 4 in which each said second MOSFET has an effective resistance of the order of $10^9$ to $10^{13}$ ohms and each said signal coupling capacitor has a capacitance of about 5 picofarads or less.

7. A low frequency field effect amplifier comprising:

a silicon substrate;

a first field effect transistor formed on said substrate and having a gate electrode, a source and a drain;

a coupling capacitor, formed as a conductive layer carried on said substrate with said transistor, for supplying input signals thereto;

load means for deriving output signals from the source-drain external circuit of said first transistor;

signal frequency feedback means, comprising a second field effect transistor having a source connected to the gate of said first transistor and having a drain and a gate electrode connected in common to the drain of said first transistor, for stabilizing the gain and bias level thereof;

with the source-drain current path of said second transistor providing signal frequency dynamic feedback to the gate electrode of said first transistor to stabilize the gain thereof within a predetermined range of gain values;

whereby a plurality of such amplifiers may be manufactured with assurance that a substantial majority thereof will be constrained to have gain factors within said predetermined range.

8. An amplifier in accordance with claim 7 wherein said second field effect transistor has associated therewith a source-to-substrate p-n junction having parameters such that the reverse current supplied therethrough is sufficient to bias said second transistor to operate in a slightly on condition and to thereby exhibit a dynamic resistance, for small signals under normal operating conditions, of the order of $10^9$ to $10^{13}$ ohms.

9. A field effect circuit in accordance with claim 7 further comprising an electromagnetic radiation sensing element in the form of a layer of radiation sensitive material superimposed on said substrate over said field effect transistors for providing input signals to said amplifier representative of intensity variations in the electromagnetic radiation impinging thereon.

10. A monolithic integrated circuit array having a large plurality of amplifier subcircuits from which a corresponding plurality of output signals may be derived with all of said subcircuits having a gain factor of the same order of magnitude and with each of said subcircuits comprising in combination:

a first field effect transistor having a gate electrode, a source and a drain;

a coupling capacitor, formed as a conductive layer carried on the same substrate with said transistor, for supplying input signals thereto;

load means for deriving output signals from the source-drain external circuit of said first transistor;

signal frequency feedback means, comprising a second field effect transistor having a source connected to the gate of said first transistor and having a drain and a gate electrode connected in common to the drain of said first transistor for stabilizing the gain and bias level thereof;

with the source-drain current path of said second transistor providing signal frequency dynamic feedback to the gate electrode of said first transistor to stabilize the gain thereof within a predetermined range of gain values and thereby significantly minimize statistical spread of the degree to which separate throughput signals are amplified by said array.

11. An integrated circuit array in accordance with claim 10 wherein each second field effect transistor has associated therewith a source-to-substrate p-n junction and wherein each such p-n junction and the source-drain current path of said second field effect transistor form an ultra-high impedance biasing network for stabilizing the DC bias applied to the associated first field effect transistor whereby the statistical spread of the DC levels derived from the plurality of said load means is significantly minimized.

12. An integrated circuit in accordance with claim 10 and further comprising a plurality of electromagnetic sensing elements each comprising a layer of radiation sensitive material and each being superimposed on said substrate overlying a separate one of said amplifier subcircuits and being connected to the coupling capacitor of the associated subcircuit for providing input signals to the associated subcircuit representative of intensity variations in the electromagnetic radiation impinging on the substrate area occupied by the associated subcircuit.

* * * * *